(12) United States Patent
Chen et al.

(10) Patent No.: US 10,802,602 B2
(45) Date of Patent: Oct. 13, 2020

(54) INPUT DEVICE WITH OVERLAPPING KEY STRUCTURE

(71) Applicant: Logitech Europe S.A., Lausanne (CH)

(72) Inventors: Kuo Hsiang Chen, Toufen (TW); Etienne Julien-Laferriere, Courtaman (CH); Feng Hao Lin, Hsinchu (TW); Cheng Kai Yuan, Taoyuan (TW)

(73) Assignee: Logitech Europe S.A., Lausanne (CH)

( * ) Notice: Subject to any disclaimer, the term of this patent is extended or adjusted under 35 U.S.C. 154(b) by 40 days.

(21) Appl. No.: 15/985,046

(22) Filed: May 21, 2018

(65) Prior Publication Data

US 2019/0354197 A1    Nov. 21, 2019

(51) Int. Cl.
| | |
|---|---|
| *H01H 13/44* | (2006.01) |
| *G06F 3/02* | (2006.01) |
| *H03K 17/96* | (2006.01) |
| *H01H 13/704* | (2006.01) |
| *H01H 13/7073* | (2006.01) |

(52) U.S. Cl.
CPC ............ *G06F 3/0202* (2013.01); *H01H 13/44* (2013.01); *H01H 13/704* (2013.01); *H01H 13/7073* (2013.01); *H03K 17/9638* (2013.01)

(58) Field of Classification Search
CPC .... H01H 13/705; H01H 13/785; H01H 13/83; G07G 1/0018; G02B 6/006
USPC ............... 1/1; 200/314, 341, 516; 235/145 R
See application file for complete search history.

(56) References Cited

U.S. PATENT DOCUMENTS

| | | | | |
|---|---|---|---|---|
| 3,999,025 | A * | 12/1976 | Sims, Jr. ............. | H01H 13/705 200/516 |
| 5,739,507 | A * | 4/1998 | Hochgesang ........ | G07G 1/0018 235/145 R |
| 5,975,711 | A * | 11/1999 | Parker .................... | G02B 6/006 200/314 |
| 2010/0187079 | A1* | 7/2010 | Dumont ................ | H01H 13/83 200/341 |
| 2017/0345589 | A1* | 11/2017 | Wu ....................... | H01H 13/785 |

\* cited by examiner

*Primary Examiner* — Abdul-Samad A Adediran
(74) *Attorney, Agent, or Firm* — Kilpatrick Townsend & Stockton LLP

(57) ABSTRACT

An input device having an overlapping key structure includes a plurality of keys, each of the plurality of keys configured to actuate a respective key switch in response to an applied mechanical force; and a key support frame, where each of the plurality of keys includes a spring arm portion coupled to the key support frame at a first end of the each of the plurality of keys such that the each of the plurality of keys deflects through a range of motion in response to the applied mechanical force, and each of the plurality of keys overlaps with another one of the plurality of keys such that each of the plurality of keys is included in an envelope of a two-dimensional cross section of the range of motion of another one of the plurality of keys when viewed from a direction perpendicular to the two-dimensional cross section.

33 Claims, 10 Drawing Sheets

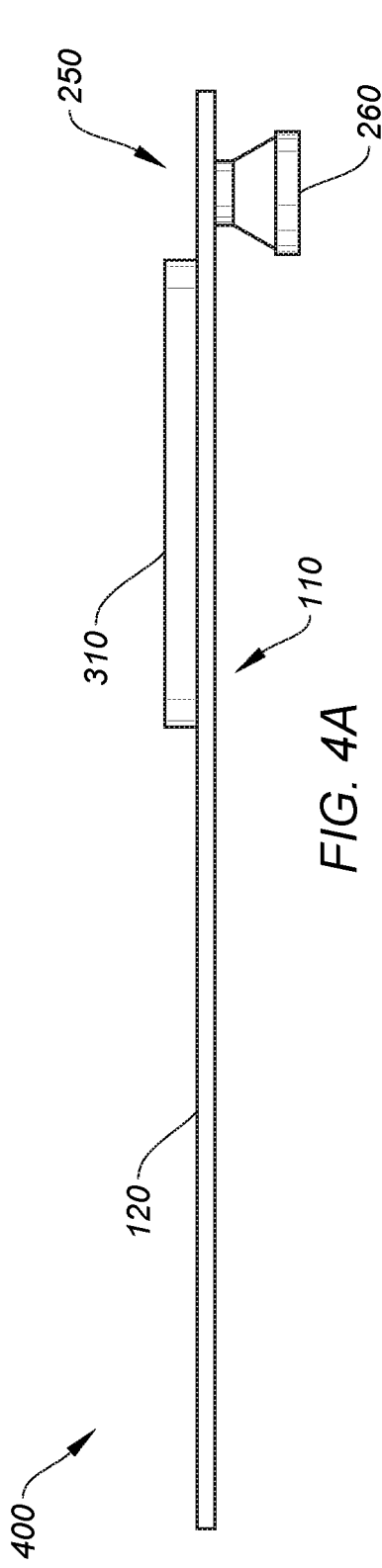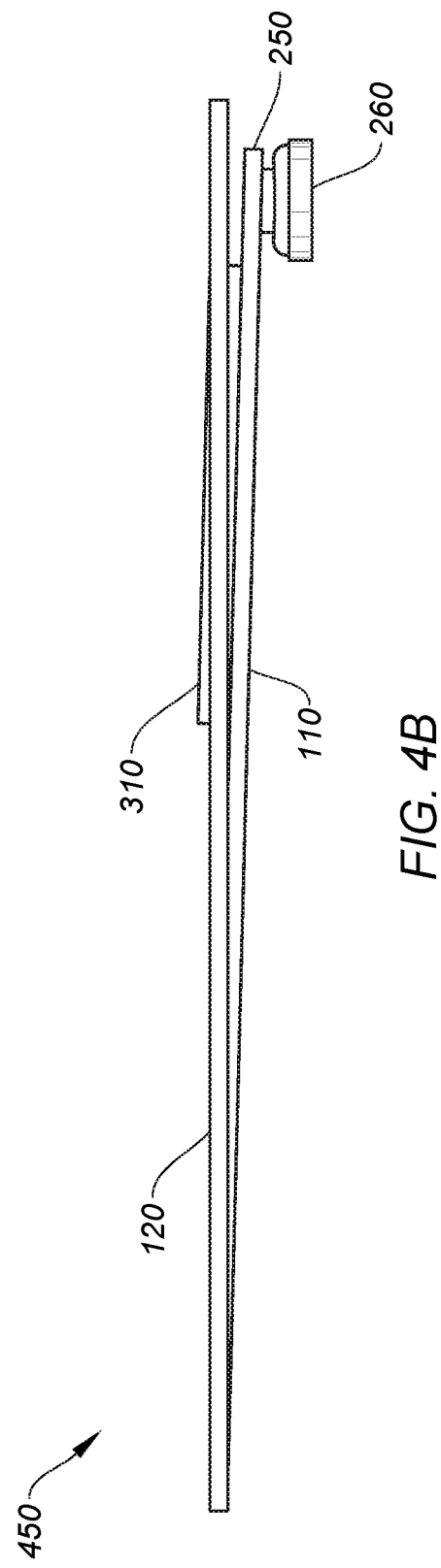

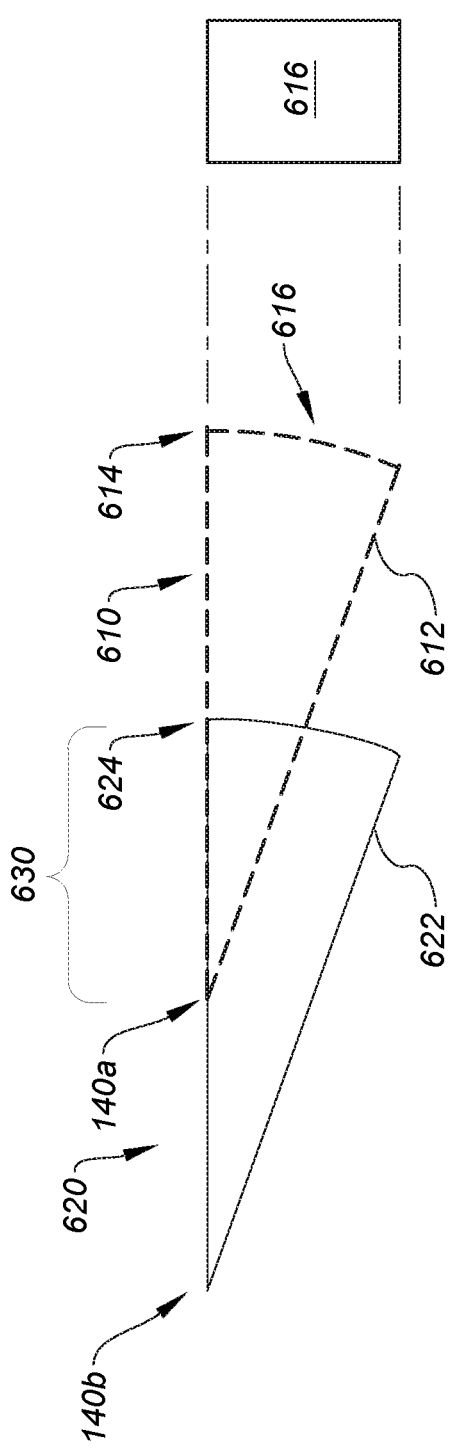
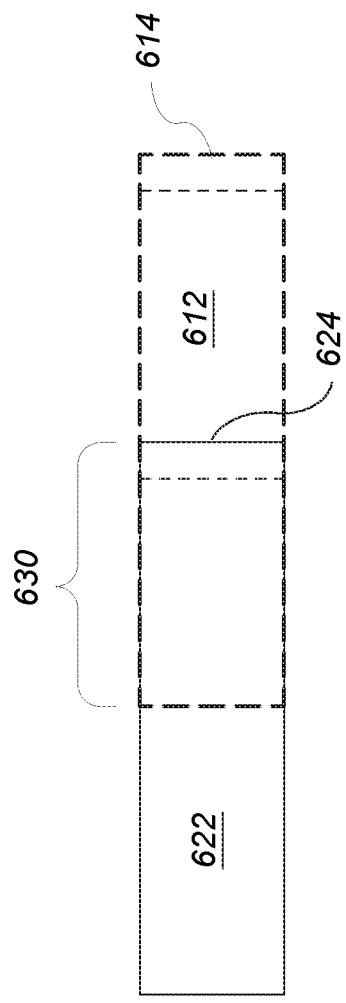
FIG. 6B
FIG. 6C
FIG. 6D

INPUT DEVICE WITH OVERLAPPING KEY STRUCTURE

BACKGROUND

Unless otherwise indicated herein, the materials described in this section are not prior art to the claims in this application and are not admitted to be prior art by inclusion in this section.

Conventional mechanical keyboard devices use various types of keys such as scissor keys and butterfly keys. While these keys typically provide a "feel" based on key travel and "clicking" sound that users have become accustomed to, the keys are mechanically complex and expensive to produce. In addition, the mechanical key structure makes effective backlighting of the key difficult. Plunger type keys, while mechanically less complex, provide the desirable "feel," but are too thick and present similar problems for backlighting of the keys. Membrane keyboards (e.g., Polyethylene Terephthalate (PET)) and capacitive touch keyboards, while also less mechanically complex, fail to provide the desirable "feel."

SUMMARY

Apparatuses for an input device having an overlapping key structure are provided.

According to various aspects there is provided an input device having an overlapping key structure. In some aspects, the input device may include: a plurality of keys, each of the plurality of keys configured to actuate a respective key switch in response to an applied mechanical force; and a key support frame. Each of the plurality of keys may include a spring arm portion coupled to the key support frame at a first end of the each of the plurality of keys such that the each of the plurality of keys deflects through a range of motion in response to the applied mechanical force. Each of the plurality of keys overlaps with another one of the plurality of keys such that each of the plurality of keys is included in an envelope of a two-dimensional cross section of the range of motion of another one of the plurality of keys when viewed from a direction perpendicular to the two-dimensional cross section.

The spring arm portion may extend to a length equal to or greater than a length of a key cap portion of a key in a direction opposite the direction that the spring arm portion extends.

The input device may further include hinge structures disposed at the first end of each of the spring arm portion, the hinge structures may be configured to connect each of the plurality of keys to the key support frame such that flexibility of the hinge structures enables movement of each of the plurality of keys in the envelope of the two-dimensional cross section of the range of motion. The key support frame, the plurality of keys, and the hinge structures may be integrally formed.

Each of the plurality of keys may have a protrusion extending from a key cap portion of a key opposite the direction of extension of the spring arm portion. The protrusion may contact the key switch.

According to various aspects there is provided an input device having an overlapping key structure. In some aspects, the input device may include: a key support frame; a plurality of keys, each of the plurality of keys having a pair of spring arms extending away from a key cap portion of the key and spaced apart from the key support frame, at least a portion of each of the pair of spring arms being parallel to a portion of the key support frame; and hinge structures disposed at extended ends of each of the spring arms, the hinge structures configured to connect each of the plurality of keys to the key support frame such that flexibility of the hinge structures enables movement of each of the plurality of keys in a direction substantially perpendicular to the key support frame.

The spring arms may extend to a length equal to or greater than a length of the key cap portion, and be spaced apart a distance greater than a width of the key cap portion. Each spring arm may extend parallel to the key support frame and adjacent to a key cap portion of a preceding key. Adjacent keys may be interleaved with a key cap portion of the preceding key disposed in an area between the spring arms of a following key.

The hinge structures may include a portion having a thickness less than a thickness of the spring arms. Each of the keys may have a protrusion extending from the key cap portion of the key opposite the direction of extension of the spring arms. The protrusion may contact a key switch. The key cap portion of the key may be a circumferential frame forming an open center portion and may accept a key cap. The key cap may be substantially transparent.

The key support frame, the plurality of keys, and the hinge structures may be integrally formed of a thin material. The thin material may be a flexible metal or plastic.

According to various aspects there is provided a key for a keyboard input device having interleaved keys. In some aspects, the key may include: a key cap portion; a pair of spring arms extending away from the key cap portion of the key; and hinge portions disposed at extended ends of each of the spring arms, the hinge portions configured to connect the key to a support frame such that flexibility of the hinge portions enables movement of the key in a direction substantially perpendicular to the support frame.

The spring arms may extend to a length equal to or greater than a length of the key cap portion, and be spaced apart a distance greater than a width of the key cap portion. The hinge portions may include a portion having a thickness less than a thickness of the spring arms. Each of the keys may have a protrusion extending from the key cap portion of the key in a direction opposite the direction of extension of the spring arms. The protrusion may contact a key switch. The key cap portion of the key may be a circumferential frame forming an open center portion and may accept a key cap. The key cap may be substantially transparent.

According to various aspects there is provided method of fabricating a keyboard input device. In some aspects, the method may include: integrally forming an assembly including a key frame, a plurality of keys, and a plurality of hinge structures; and attaching key caps to each of the plurality of keys. The key caps may be attached with adhesive or may be injection molded to the keys. The key caps may be transparent.

A backlight device may be attached to the assembly. the backlight device may be a display panel or a light guide.

BRIEF DESCRIPTION OF THE DRAWINGS

Aspects and features of the various embodiments will be more apparent by describing examples with reference to the accompanying drawings, in which:

FIGS. 4A and 4B illustrate a key in unpressed and depressed positions, respectively, according to various aspects of the present disclosure;

FIG. 6B is an illustration 650 of the sectors in which the keys move in accordance with various aspects of the present disclosure;

FIG. 6C is an illustration of a two-dimensional cross section corresponding to FIG. 6B in accordance with various aspects of the present disclosure;

FIG. 6D is an illustration of the first and second sectors viewed from a direction perpendicular to the two-dimensional cross section in accordance with various aspects of the present disclosure;

DETAILED DESCRIPTION

While certain embodiments are described, these embodiments are presented by way of example only, and are not intended to limit the scope of protection. The apparatuses and systems described herein may be embodied in a variety of other forms. Furthermore, various omissions, substitutions, and changes in the form of the example methods and systems described herein may be made without departing from the scope of protection.

Apparatuses consistent with the present inventive concept relate to keyboard input devices, and more particularly to an input device having an overlapping key structure.

Figure 1:
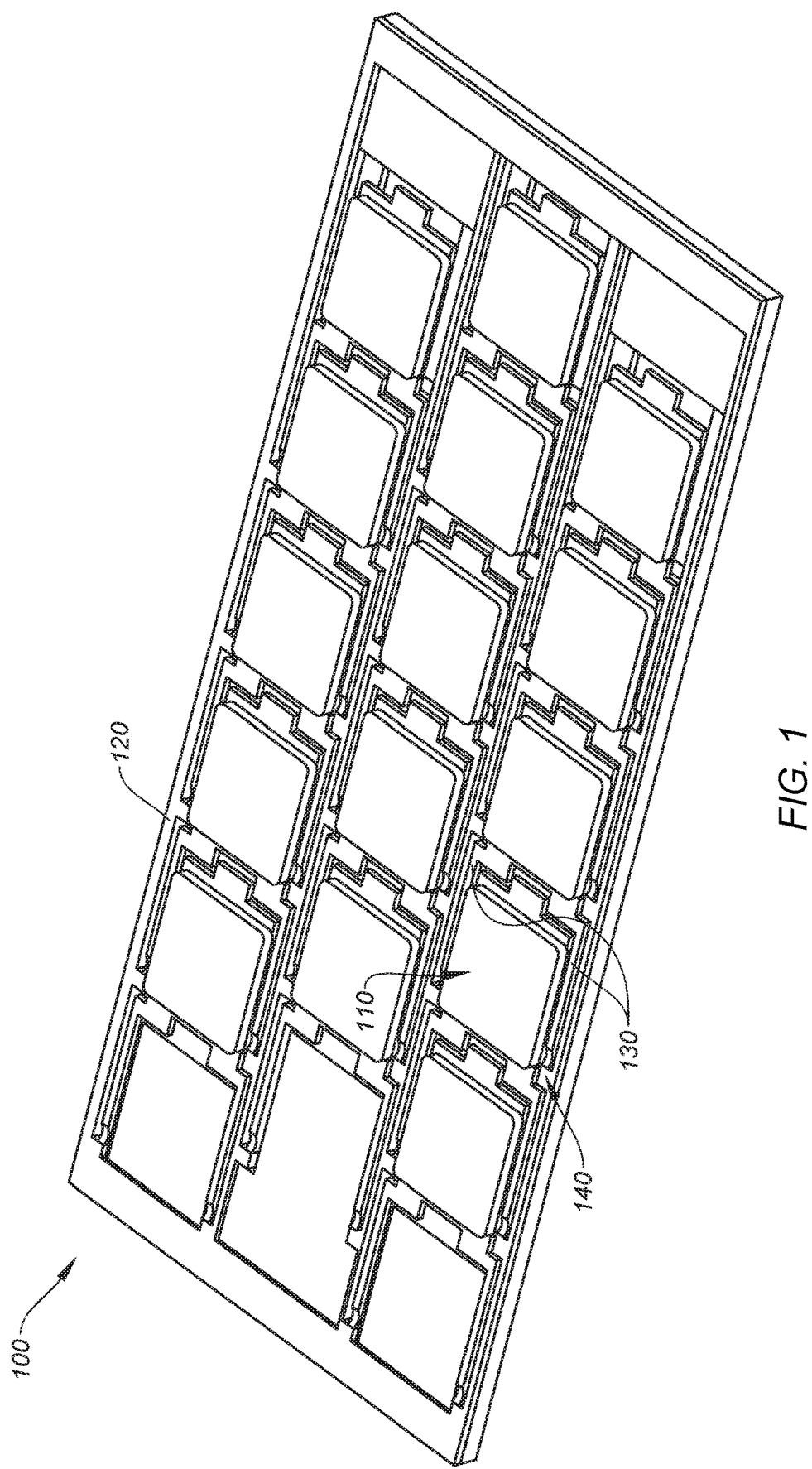
FIG. 1 is a perspective view of an input device having an overlapping key structure according to various aspects of the present disclosure.

FIG. 1 is a perspective view of an input device 100 having an overlapping key structure according to various aspects of the present disclosure. Referring to FIG. 1, a plurality of keys 110 are supported in a key support frame 120 by a pair of spring arms 130. A hinge structure 140 attaches each spring arm 130 to the key support frame 120. The hinge structures 140 provide flexibility to enable the keys 110 to be depressed and to cause the keys 110 to rebound to their original positions. As shown in FIG. 1, portions of the keys 110 are interleaved, or overlapped, with areas in which portions of the spring arms 130 of other keys 110 are disposed to form a compact assembly.

Figure 2:
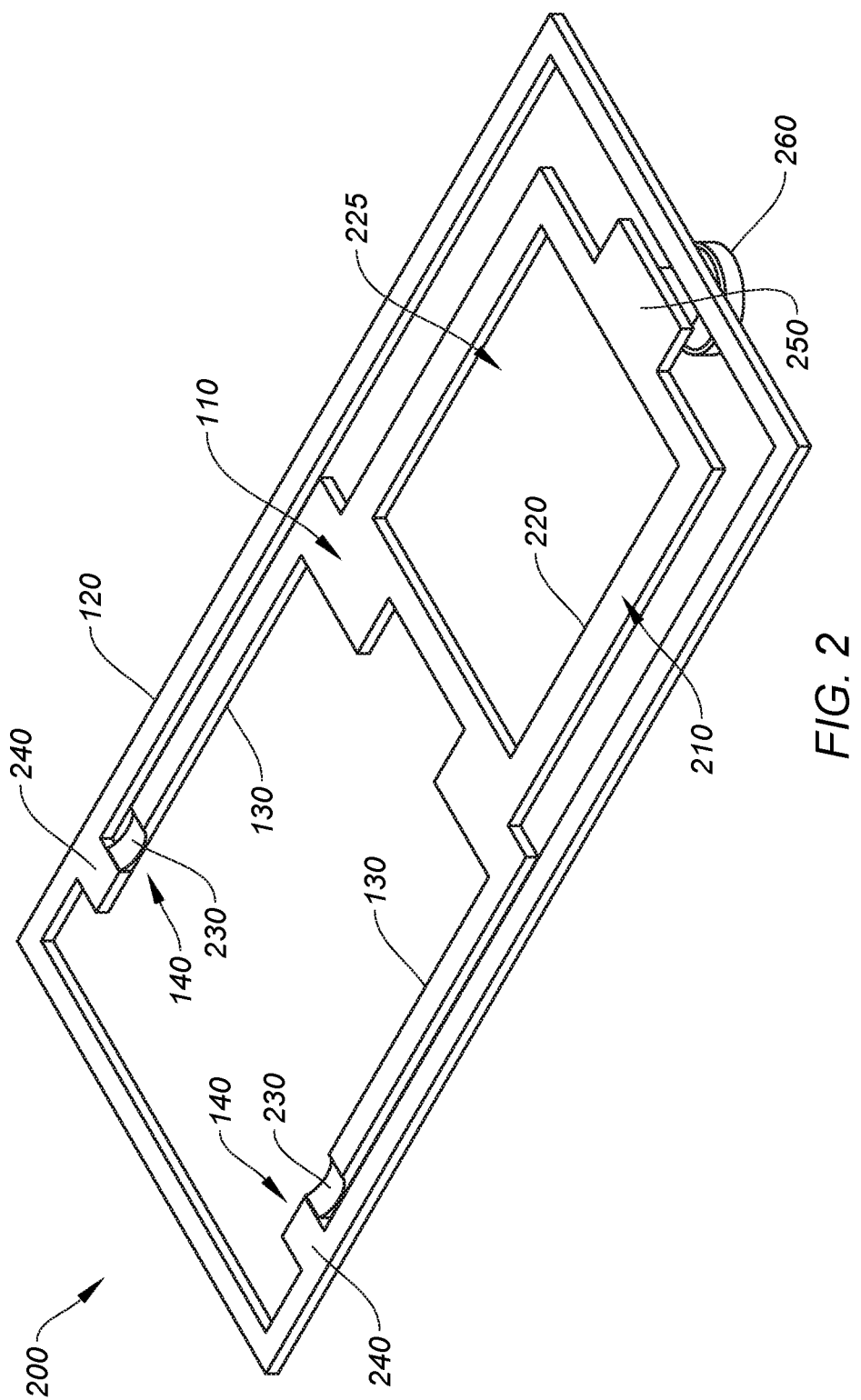
FIG. 2 is a representative illustration of a key and hinge structures disposed in a portion of a key support frame according to various aspects of the present disclosure.

FIG. 2 is a representative illustration 200 of a key 110 and hinge structures 140 disposed in a portion of a key support frame 120. The key 110 may include the spring arms 130, a key cap portion 210, and a protrusion 250. A length of the key 110 may be defined in a direction from an end of the spring arms 130 to an end of the key cap portion 210 in a plane substantially perpendicular to a direction from which a mechanical force is applied to depress the key 110. A width direction of the key 110 may be defined in a direction perpendicular to the length direction of the key 110 in a same plane as the length direction of the key 110. The spring arms 130 may extend away from the key cap portion 210 in a lengthwise direction of the key 110 to a distance approximately equal to a length of the key cap portion 210 and may be spaced apart a distance greater than a width of the key cap portion 210 of the key 110. The hinge structures 140 may include flanges 240 formed on the key support frame 120 and hinge portions 230 formed at the extended ends of the spring arms 130.

The hinge portions 230 of the spring arms 130 may have a thickness less than the thickness of the remaining portions of the spring arms 130. One of ordinary skill in the art will appreciate that while radiused hinge portions 230 are illustrated as reduced thickness portions of the spring arms 130 in FIG. 2, other configurations for reducing, for example but not limited to tapering, may be used without departing from the scope of the present disclosure. Alternatively, the hinge portions 230 of the spring arms 130 may have the same thickness as the remaining portions of the spring arms 130.

The key cap portion 210 of the key 110 may include a circumferential frame 220 forming an open center portion 225. The key cap portion 210 of the key 110 may be configured to mount a key cap. A protrusion 250 may extend from the circumferential frame 220 of the key cap portion 210 in a direction opposite the direction of extension of the spring arms 130 and may contact a key switch 260 when the key 110 is depressed. One of ordinary skill in the art will appreciate that other configurations for contacting the key switch 260, for example, but not limited to positioning the protrusion at another location on the on the key cap portion 210 such as on a side, a middle, or an edge of the key cap portion 210, or eliminating the protrusion 250 and contacting the key switch 260 with the circumferential frame 220, without departing from the scope of the present disclosure. In accordance with various aspects of the present disclosure, the key cap portion 210 may include a solid planar portion (not shown) in place of the circumferential frame 220. The solid planar portion may accommodate a fabric key cover.

Figure 3:
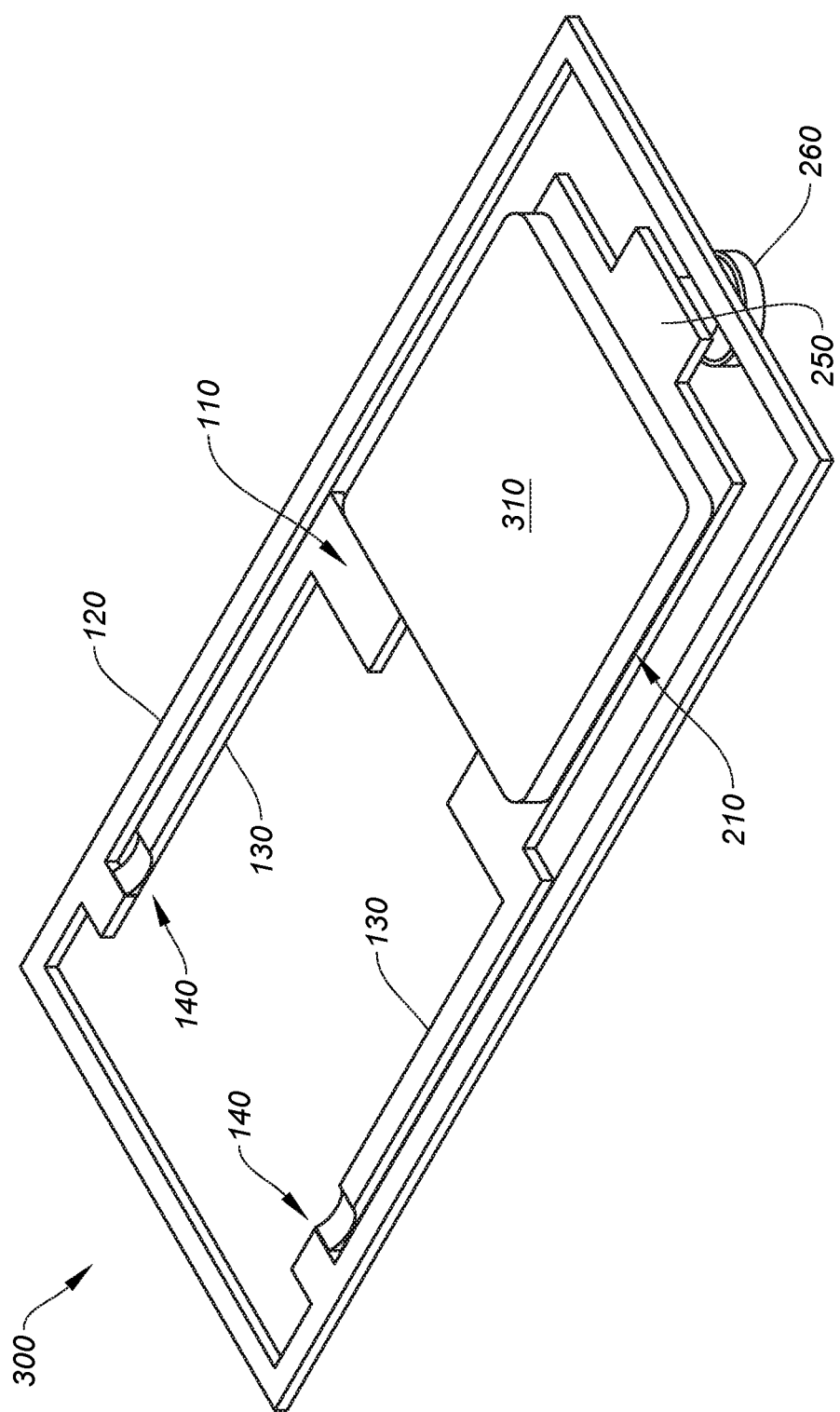
FIG. 3 is a representative illustration of a key with a key cap and hinge structures disposed in a portion of a key support frame according to various aspects of the present disclosure.

FIG. 3 is a representative illustration 300 of a key 110 with a key cap 310 and hinge structures 140 disposed in a portion of a key support frame 120. The key cap 310 may be retained on the key cap portion 210 of the key 110 by any suitable means, for example but not limited to adhesive. Alternatively, the key cap 310 may be formed as part of the key 110 by, for example but not limited to, injection molding the keycap 310 on the key 110. The key cap 310 may be substantially transparent. For example, a transparent key cap 310 may permit definition of key press functions based in images, for example but not limited to icons, displayed on an underlying display panel (not shown). Alternatively, the key cap 310 may be partially or completely opaque and may additionally include an image (e.g., a letter, number, symbol, icon, etc.) indicating the function of the key 110 on which the key cap 310 is disposed.

FIGS. 4A and 4B are representative illustrations of a key 110 in an unpressed position 400 and a depressed position 450, respectively, according to various aspects of the present disclosure. Referring to FIG. 4A, in an unpressed position 400, the key 110 may be disposed in substantially a same plane as the key support frame 120. The protrusion 250 of the key 110 may rest on the key switch 260. Alternatively, the protrusion 250 may not rest on the key switch 260 and the key 110 may be supported in a cantilever manner by the spring arms 130 and hinge structures 140.

FIG. 4B illustrates the key 110 in a depressed position 450. The key 110 is depressed, for example, by a mechanical force exerted on the key cap 310. In the depressed position 450, the key 110 pivots on the hinge structures 140 such that the protrusion 250 depresses the key switch 260. The key switch 260 may be a rubber-covered dome-type switch. The rubber-covered dome-type switch may contribute to a more natural "feel" when the key 110 is operated. Alternatively, the key switch 260 may be mechanical switch, capacitive switch, or other dome-type switch known to those of skill in the art.

According to various aspects of the present disclosure, haptic feedback may be provided when the key 110 is pressed. Movement of the key 110 from the unpressed position to the pressed position and back to the unpressed position may be achieved by the flexibility of the hinge structures 140 and may be aided by the action of the key switch 260. Deflection of the key 110 through a range of motion may be within an envelope or sector formed as the end of the key moves in an arc cantilevered about the hinge structures 140. The key movement may be similar to the motion of a diving board as illustrated in FIG. 4B. The cantilever configuration of the spring arms 130 and hinge structures 140 provides a flexible structure that causes the key 110 to rebound from a depressed position. When a mechanical force is released from the key 110, the rebound action of the key switch 260 may further assist in returning the key 110 to the unpressed position.

Figure 5:
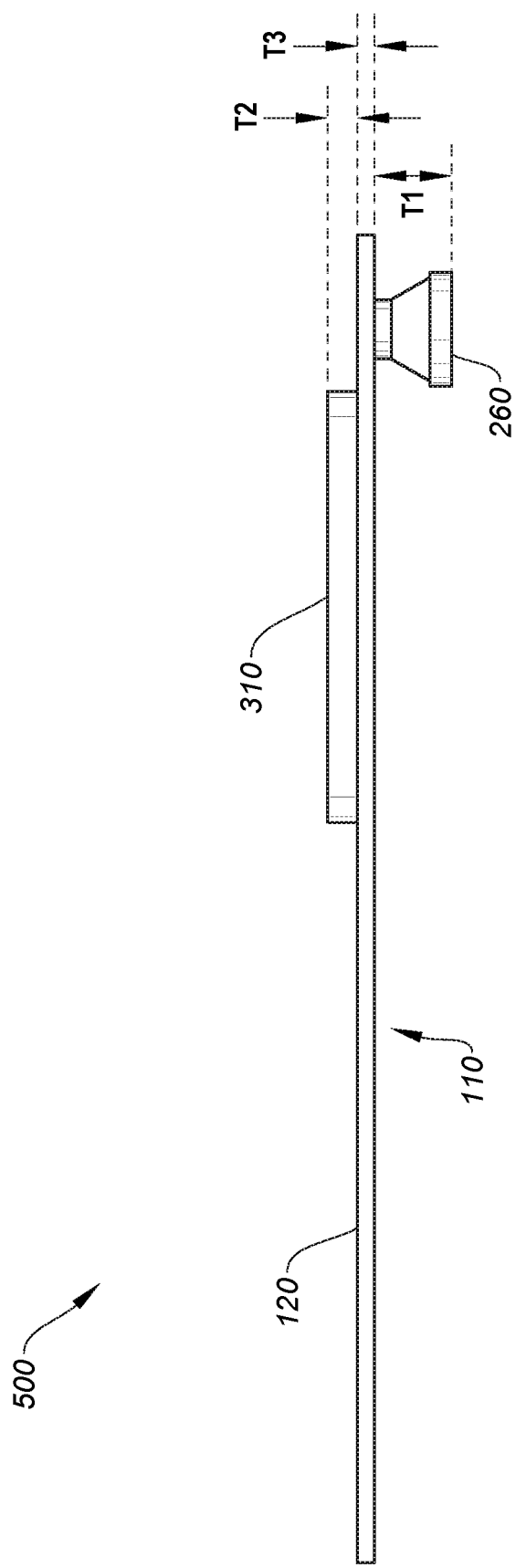
FIG. 5 is representative illustration of the thickness dimensions of a keyboard input device according to various aspects of the present disclosure.

FIG. 5 is a representative illustration 500 of the thickness dimensions of a keyboard input device according to various aspects of the present disclosure. Various embodiments of the present disclosure provide a thin keyboard input device. Referring to FIG. 5, a thickness dimension T1 for the key switch 260 may be about 2 mm or another thickness and a thickness dimension T2 for key cap 310 may be about 1 mm or another thickness. The keys 110 and the key support frame 120 may be integrally formed from the same thin flexible material, for example but not limited to thin flexible steel, plastic, etc., and may have a thickness dimension T3 of about 0.5 mm or another thickness.

Figure 6A:
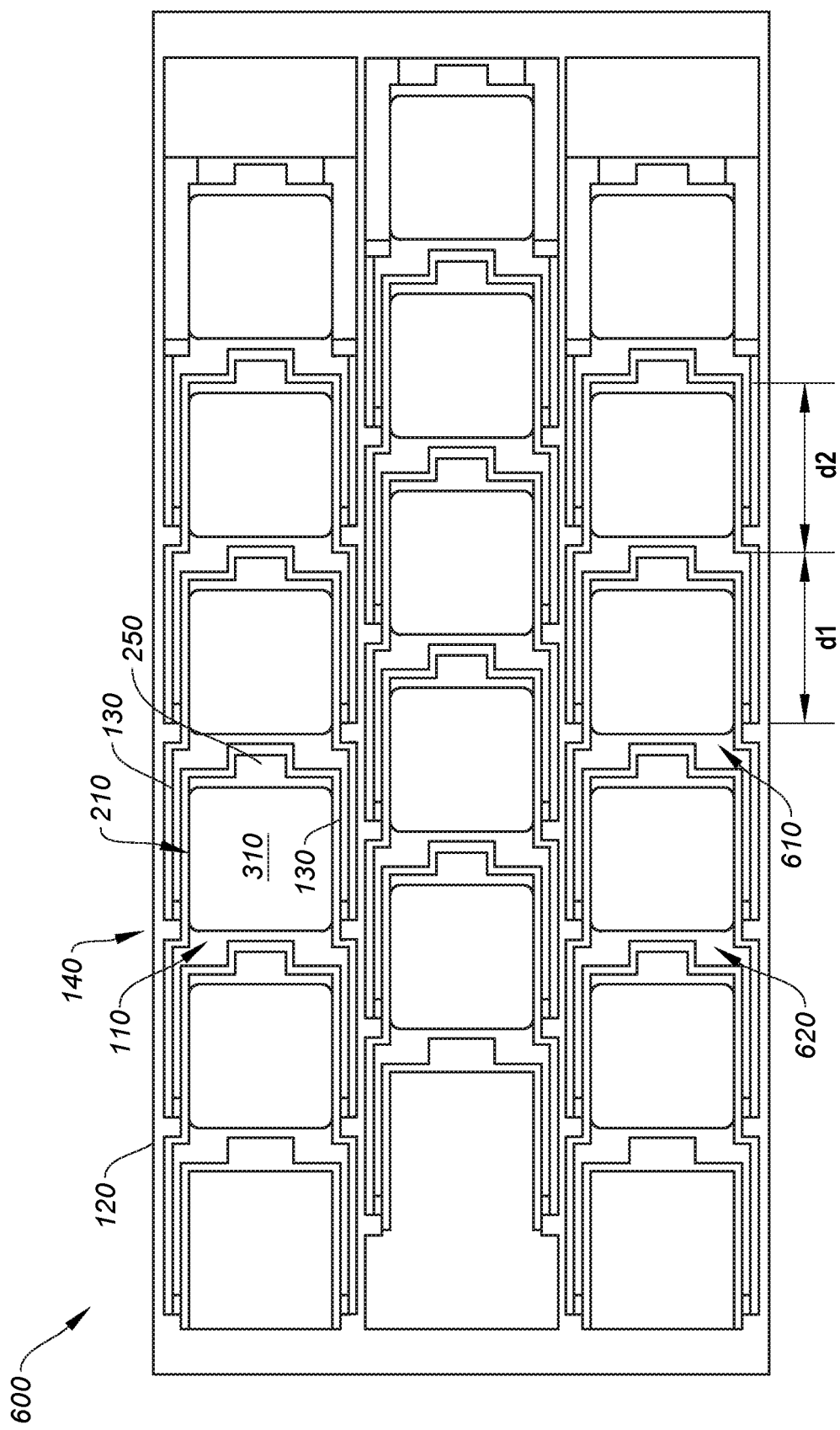
FIG. 6A is representative illustration of a keyboard input device according to various aspects of the present disclosure.

FIG. 6A is a representative illustration 600 of a keyboard input device according to various aspects of the present disclosure. As shown in FIG. 6A, portions of the keys are interleaved, or overlapped, with areas in which portions of other keys are disposed. Referring to FIG. 6A, first key 610 and second key 620 include the features of the representative key 110 (i.e., spring arms 130, hinge structures 140, key cap portion 210 and protrusion 250); however, for clarity these features are labeled only on the representative key 110.

As shown in FIG. 6A, the length dl of the spring arms of each key is approximately the same length d2 of the key cap portion 210 of the key (i.e., d1≈d2). In other words, the length of the spring arms is about one half the overall length of the key. This ratio of the spring arm length to the length of the key cap portion contributes to the stability of the key (i.e., reduces key wobble) as the key is operated compared to other keys. The absolute length of the spring arms may affect the stability of the key in a lengthwise direction of the key while the length of the spring arms with respect to the overall length of the key may affect the stability of the key in a widthwise direction of the key.

As further illustrated in FIG. 6A, adjacent keys may be interleaved and overlapped. The spring arms of the first (i.e., preceding) key 610 may be spaced apart wider than the width of the key cap portion of the second (i.e., following) key 620 in a plane in which the first and second keys 610, 620 are disposed and may extend into an area surrounding the key cap portion of the second key 620. In addition, the first key 610 may be formed with a space to accommodate the protrusion of the second key 620 and permitting a more narrow key spacing. The spring arms of the first key 610 and the key cap portion of the second key 620 overlap a common area enabling a configuration of interleaved and overlapping keys to produce a compact keyboard input device. In other words, the envelope of movement, or sector, of the first key 610 overlaps the sector of the second key 620.

FIG. 6B is an illustration of the sectors in which the keys move in accordance with various aspects of the present disclosure. Referring to FIG. 6B, the first key 610 may deflect through an envelope of a two-dimensional cross section of a range of motion within the first sector 612 cantilevered around a first point 140a corresponding to a hinge structure 140 such that an opposite end of the key 610 at a second point 614 may move in an arc. The second key 620 may deflect through an envelope of a two-dimensional cross section of a range of motion within the second sector 622 cantilevered around a third point 140b corresponding to another hinge structure 140 such that an opposite end of the key 620 at a fourth point 624 may move in an arc. FIG. 6C is an illustration of the two-dimensional cross section 616 corresponding to FIG. 6B in accordance with various aspects of the present disclosure. As seen in FIG. 6C, the two-dimensional cross section 616 may be substantially rectangular.

FIG. 6D is an illustration of the first and second sectors 612, 622 viewed from a direction perpendicular to the two-dimensional cross section 616 in accordance with various aspects of the present disclosure. Referring to FIGS. 6A-6D, due to the interleaving of the key cap portion of the second key 620 with the spring arms of the first key 610 an overlap region 630 is created with the first sector 612 in which the first key 610 moves and the second sector 622 in which the second key 620 moves are overlapped.

In accordance with various aspects of the present disclosure, the overlapping sectors and interleaved keys of the keyboard input device 100 enable the keyboard input device 100 to be integrated along a non-planar surface, for example but not limited to an ergonomic keyboard. In accordance with various aspects of the present disclosure, curvilinear configurations of the keyboard input device may be provided. In such configurations, consistent spacing between the spring arms and key support frame as well as between the key cap portion of the key and the key frame may be maintained in a manner similar to those spacings in a linear keyboard configuration.

One of ordinary skill in the art will appreciate that while the various embodiments are depicted and described with the keys arranged in a substantially horizontal configuration with respect to the key frame, other configurations, for example but not limited to a vertical configuration of the keys with respect to the key frame, may be contemplated using the disclosed ratio of spring arm length to overall key length without departing from the scope of the present disclosure.

Figure 7:
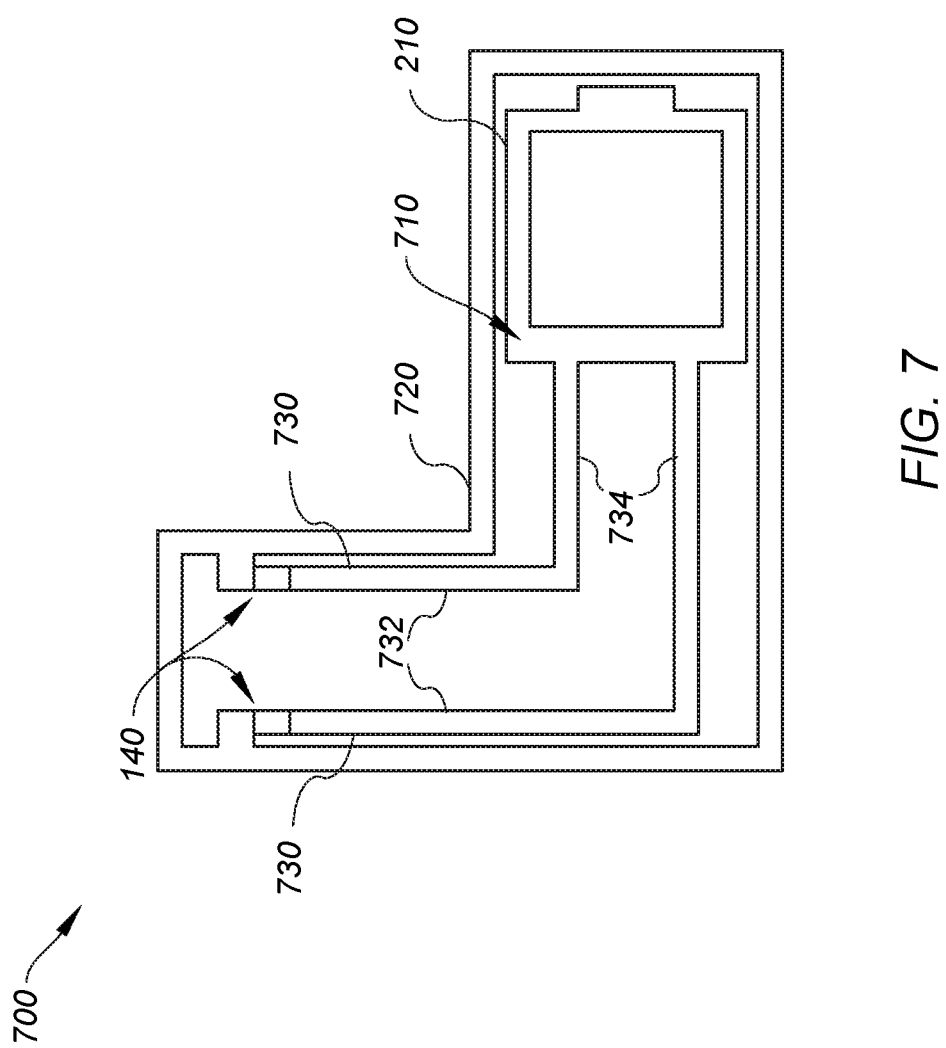
FIG. 7 is an illustration of a key having the key cap portion offset at an angle with respect to the spring arms in accordance with various aspects of the present disclosure.

In accordance with various aspects of the present disclosure, a keyboard input device may include keys having the key cap portion offset at an angle with respect to the spring arms. FIG. 7 is an illustration of a key 710 having the key cap portion 210 offset at an angle with respect to the spring arms 730 in accordance with various aspects of the present disclosure.

Referring to FIG. 7, the key 710 may be dispose within a key frame 720 and may include hinge structures 140, spring arms 730, a key cap portion 715. The hinge structures 140 and key cap portion 210 have been previously described with respect to FIG. 2 and their descriptions will not be repeated here.

The spring arms 730 may include first spring arm portions 732 and second spring arm portions 734. The first spring arm portions 732 and second spring arm portions 734 may be disposed in substantially the same plane. The first spring arm portions 732 may include the hinge portions 740 and the second spring arm portions 734 may be connected to the key cap portion 715. The first spring arm portions 732 may be disposed an angle to the second spring arm portions 734. Thus, the key cap portion 715 of the key 710 may be disposed at an angle with respect to the attachment of the first spring arm portions 732 to the hinge structures 740. While FIG. 7 illustrates the first spring arm portions 732 disposed at an angle of substantially 90 degrees to the second spring arm portions 734, one of ordinary skill in the art will appreciate that the first and second spring arm portions may be disposed at other angles without departing from the scope of the present disclosure.

Figure 8:
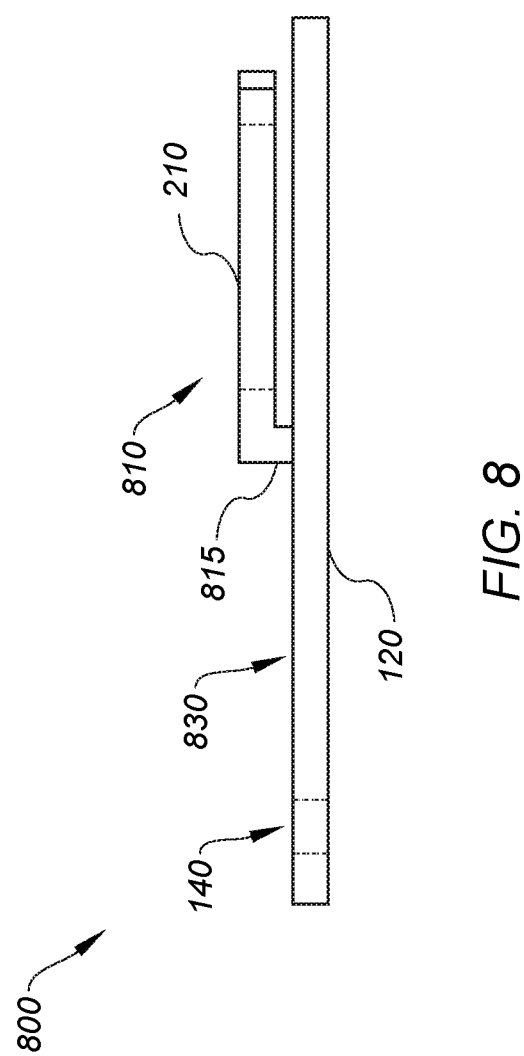
FIG. 8 is a representative illustration of a key having a key cap portion disposed in a plane different from a plane in which the spring arms are disposed in accordance with various aspects of the present disclosure.

In accordance with further aspects of the present disclosure, referring again to FIG. 2, the key cap portion 210 of the key 110 and the spring arms 130 may be disposed in substantially the same plane. Alternatively, the key cap portion of the key may be disposed in a different plane that is substantially parallel to a plane in which the spring arms are disposed. FIG. 8 is a representative illustration 800 of a key 810 having a key cap portion disposed in a plane different from a plane in which the spring arms are disposed in accordance with various aspects of the present disclosure. Referring to FIG. 8, the key 810 may include spring arms 830 disposed in a same plane as the key support frame 120 and hinge structures 140. The spring arms 830 may include an angled portion 815 connecting the key cap portion 210 to the spring arms 830. The angled portions 815 may be directed approximately 90 degrees or another angle to the plane in which the spring arms 830 are disposed. When the angled portions 815 are connected to the key cap portion 210, the key cap portion 210 may be disposed in a plane substantially parallel to but different from the plane in which the spring arms 830 are disposed.

Figure 9:
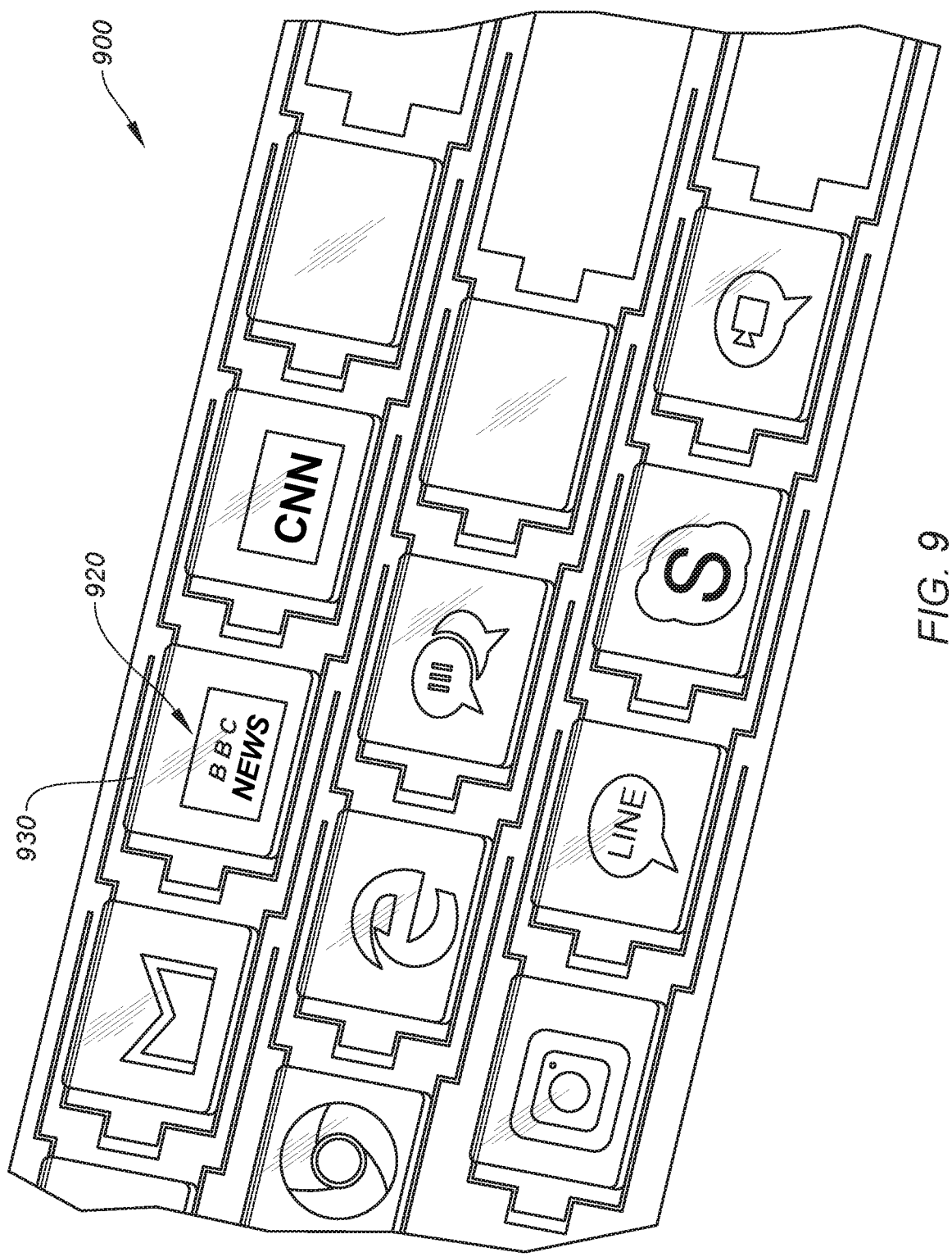
FIG. 9 is an illustration of a keyboard input device positioned over a display in accordance with various aspects of the present disclosure.

An additional aspect of the presently disclose keyboard input device is the amount of space available beneath the key cap to provide backlighting of the key. FIG. 9 is an illustration of a keyboard input device 900 positioned over a display 910 in accordance with various aspects of the present disclosure. As shown in FIG. 9, the display 910 positioned beneath the keyboard input device 900 defines the key functions, here icons 920 representing various application), as well as providing backlighting for the key caps 930. One of ordinary skill in the art will appreciate that other forms of backlighting known in the art may be used, for example but not limited to a light guide plate, without departing from the scope of the present disclosure. By using a substantially transparent key cap 930 almost the entire key cap area (approximately 85% or more) may be available to be backlight by the display.

Conventional keys (e.g., scissor keys, butterfly keys, plunger keys, etc.) require mechanisms that occupy the space beneath the keys. Backlighting such keys can be complicated and expensive due to occlusion cause by the mechanism. The keys 110 according to the present disclosure do not require the mechanical structures as do conventional keys. In accordance with various aspects of the present disclosure, key functions may be defined on the key caps 930 and without the conventional obstructions beneath the key caps 930 backlighting may be easily provided. For example, the key caps 930 may be partially opaque with key functions printed on the key caps 930. The keys 110 may be individually backlit, for example with separate LEDs, or the entire keyboard may be underlaid with a continuous screen, for example but not limited to, an LED panel, to provide backlighting. One of ordinary skill in the art will appreciate that other techniques for indicating the key functions and providing backlighting may be easily employed without departing from the scope of the present disclosure.

Advantageously, the keyboard input device according to various aspects of the present disclosure may be fabricated using straightforward manufacturing processes. The key support frame, the plurality of keys, and the hinge structures are integrally formed of a thin flexible material. For example, once a layout for the keys is determined, the key support frame, the plurality of keys, and the hinge structures may be stamped from a single sheet of flexible metal or may be formed as a single piece of molded plastic. One of ordinary skill in the art will appreciate that other suitable materials and fabricating methods may be used without departing from the scope of the present disclosure.

Key caps may subsequently be attached to the plurality of keys, for example with a suitable adhesive or other mechanical means known to those of skill in the art. Alternatively, the key caps may be injection molded on the keys. In addition, the flexibility of the key frame and associated keys may allow for use of the keyboard input device of the present disclosure in non-planar configurations (e.g., ergonomic keyboards and/or control panels, etc.) and/or curvilinear configurations.

The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. An input device having an overlapping key structure, the input device comprising:
   a plurality of keys, each of the plurality of keys configured to actuate a respective key switch in response to an applied mechanical force; and
   a key support frame;
   wherein each of the plurality of keys includes a spring arm portion comprising two parallel spring arms extending from an edge of a keycap portion, each of the spring arms being fixedly coupled to the key support frame at a first end of the each of the plurality of keys such that the each of the plurality of keys deflects through a range of motion in response to the applied mechanical force; and
   wherein each of the plurality of keys overlaps with another adjacent one of the plurality of keys such that each of the plurality of keys is included in an envelope of a two-dimensional cross section of the range of motion of the another adjacent one of the plurality of keys when viewed from a direction perpendicular to the two-dimensional cross section.

2. The input device of claim 1, wherein the spring arm portion extends to a length equal to or greater than a length of a key cap portion in a direction opposite the direction that the spring arm portion extends.

3. The input device of claim 1, further comprising hinge structures disposed at the first end of each of the spring arm portion, the hinge structures comprising reduced thickness portions configured to fixedly connect each of the plurality of keys to the key support frame such that flexibility of the hinge structures enables movement of each of the plurality of keys in the envelope of the two-dimensional cross section of the range of motion.

4. The input device of claim 3, wherein the key support frame, the plurality of keys, and the hinge structures are integrally formed.

5. The input device of claim 1, wherein each of the plurality of keys comprises a protrusion extending from a key cap portion of a key opposite a direction of extension of the spring arm portion, wherein the protrusion is configured to contact the key switch.

6. An input device having an overlapping key structure, the input device comprising:
  a key support frame;
  a plurality of keys, each key of the plurality of keys comprising a pair of parallel spring arms extending away from an edge of a key cap portion of the key and spaced apart from the key support frame, at least a portion of each of the pair of spring arms being parallel to a portion of the key support frame; and
  hinge structures comprising reduced portions disposed at extended ends of each of the spring arms, the hinge structures configured to fixedly connect each of the plurality of keys to the key support frame such that flexibility of the hinge structures enables movement of each of the plurality of keys in a direction substantially perpendicular to the key support frame.

7. The input device of claim 6, wherein the spring arms extend to a length equal to or greater than a length of the key cap portion in a direction opposite the direction that the spring arms extend.

8. The input device of claim 6, wherein at least a portion of each spring arm is configured to extend adjacent to a key cap portion of a preceding key, and
  wherein a pair of adjacent keys is configured with the key cap portion of the preceding key disposed in an area between spring arms of a following key.

9. The input device of claim 6, wherein the hinge structures comprise a portion having a thickness less than a thickness of the spring arms.

10. The input device of claim 6, wherein each key of the plurality of keys comprises a protrusion extending from the key cap portion of the key opposite a direction of extension of the spring arms, wherein the protrusion is configured to contact a key switch.

11. The input device of claim 6, wherein the key cap portion of at least one key of the plurality of keys comprises a circumferential frame forming an open center portion.

12. The input device of claim 11, wherein at least one key of the plurality of keys is configured to accept a key cap at the key cap portion.

13. The input device of claim 12, wherein the key cap is substantially transparent.

14. The input device of claim 12, wherein the key cap is injection molded on at least one key of the plurality of keys.

15. The input device of claim 6, wherein the key support frame, the plurality of keys, and the hinge structures are integrally formed.

16. The input device of claim 15, wherein the key support frame, the plurality of keys, and the hinge structures are integrally formed from a flexible metal.

17. The input device of claim 15, wherein the key support frame, the plurality of keys, and the hinge structures are integrally formed from a plastic.

18. A key for a keyboard input device having interleaved keys, the key comprising:
  a key cap portion;
  a pair of parallel spring arms extending away from an edge of the key cap portion of the key; and
  hinge portions comprising reduced portions disposed at extended ends of each of the spring arms, the hinge portions configured to fixedly connect the key to a support frame such that flexibility of the hinge portions enables movement of the key in a direction substantially perpendicular to the support frame.

19. The key of claim 18, wherein the spring arms extend away from the key cap portion to a length equal to or greater than a length of the key cap portion.

20. The key of claim 18, wherein the hinge portions comprise a portion having a thickness less than a thickness of the spring arms.

21. The key of claim 18, further comprising a protrusion extending from the key cap portion of the key, wherein the protrusion is configured to contact a key switch.

22. The key of claim 18, further comprising a protrusion extending from the key cap portion of the key in a direction opposite a direction of extension of the spring arms, wherein the protrusion is configured to contact a key switch.

23. The key of claim 18, wherein the key cap portion of the key comprises a circumferential frame forming an open center portion.

24. The key of claim 23, further comprising a key cap disposed at the key cap portion.

25. The key of claim 24, wherein the key cap is substantially transparent.

26. The key of claim 24, wherein the key cap is injection molded on the key.

27. A method of fabricating a keyboard input device, the method comprising:
  integrally forming an assembly including a key support frame, a plurality of keys, and a plurality of hinge structures, wherein:
    each key of the plurality of keys is formed with a pair of parallel spring arms extending away from an edge of a key cap portion of the key and spaced apart from the key support frame, at least a portion of each of the pair of spring arms being parallel to a portion of the key support frame, and
    each pair of spring arms is formed with hinge structures comprising reduced portions disposed at extended ends of each of the spring arms, the hinge structures configured to fixedly connect each of the plurality of keys to the key support frame; and
  attaching a key cap to each of the plurality of keys.

28. The method of claim 27, wherein the attaching the key caps comprises attaching the key caps to each of the plurality of keys with an adhesive.

29. The method of claim 27, wherein the attaching the key caps comprises injection molding the key caps to each of the plurality of keys.

30. The method of claim 27, wherein the key caps are substantially transparent.

31. The method of claim 27, further comprising attaching a backlight device to the assembly.

32. The method of claim 31, wherein the backlight device is a display panel.

33. The method of claim 32, wherein the backlight device is a light guide.

* * * * *